(12) United States Patent
Wagner et al.

(10) Patent No.: US 9,859,378 B2
(45) Date of Patent: Jan. 2, 2018

(54) SEMICONDUCTOR DEVICE WITH REDUCED EMITTER EFFICIENCY

(71) Applicant: Infineon Technologies AG, Neubiberg (DE)

(72) Inventors: Wolfgang Wagner, Villach (AT); Johannes Baumgartl, Riegersdorf (AT); Volodymyr Komarnitskyy, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/182,720

(22) Filed: Jun. 15, 2016

(65) Prior Publication Data

US 2016/0365413 A1    Dec. 15, 2016

(30) Foreign Application Priority Data

Jun. 15, 2015    (DE) .................. 10 2015 210 923

(51) Int. Cl.

| | | |
|---|---|---|
| *H01L 29/10* | (2006.01) | |
| *H01L 29/423* | (2006.01) | |
| *H01L 29/66* | (2006.01) | |
| *H01L 29/739* | (2006.01) | |
| *H01L 29/78* | (2006.01) | |
| *H01L 29/861* | (2006.01) | |
| *H01L 29/417* | (2006.01) | |
| *H01L 29/08* | (2006.01) | |

(52) U.S. Cl.
CPC ...... *H01L 29/1095* (2013.01); *H01L 29/0834* (2013.01); *H01L 29/41766* (2013.01); *H01L 29/4236* (2013.01); *H01L 29/66348* (2013.01); *H01L 29/66734* (2013.01); *H01L 29/7397* (2013.01); *H01L 29/7813* (2013.01); *H01L 29/861* (2013.01); *H01L 29/8613* (2013.01)

(58) Field of Classification Search
CPC .................. H01L 29/66704; H01L 29/1095
USPC ......................................... 257/330
See application file for complete search history.

(56) References Cited

U.S. PATENT DOCUMENTS

| | | | | |
|---|---|---|---|---|
| 2010/0078707 A1* | 4/2010 | Haeberlen | ........... | H01L 29/7805 257/328 |
| 2011/0287613 A1* | 11/2011 | Liu | .................. | H01L 21/0243 438/478 |
| 2012/0012661 A1 | 1/2012 | Gordon | | |

(Continued)

*Primary Examiner* — Moazzam Hossain
(74) *Attorney, Agent, or Firm* — Murphy, Bilak & Homiller, PLLC

(57) ABSTRACT

A method of producing a semiconductor device includes providing a semiconductor body having a front side 10-1 and a back side, wherein the semiconductor body includes a drift region having dopants of a first conductivity type and a body region having dopants of a second conductivity type complementary to the first conductivity type, a transition between the drift region and the body region forming a pn-junction. The method further comprises: creating a contact groove in the semiconductor body, the contact groove extending into the body region along a vertical direction pointing from the front side to the back side; and filling the contact groove at least partially by epitaxially growing a semiconductor material within the contact groove, wherein the semiconductor material has dopants of the second conductivity type.

8 Claims, 7 Drawing Sheets

(56) References Cited

U.S. PATENT DOCUMENTS

2012/0037954 A1* 2/2012 Hshieh ................ H01L 29/0638
257/139
2013/0189819 A1 7/2013 Eguchi et al.
2016/0211334 A1* 7/2016 Tanaka .............. H01L 29/66068

* cited by examiner

US 9,859,378 B2

SEMICONDUCTOR DEVICE WITH REDUCED EMITTER EFFICIENCY

PRIORITY CLAIM

This application claims priority to German Patent Application No. 10 2015 210 923.2 filed on 15 Jun. 2015, the content of said application incorporated herein by reference in its entirety.

TECHNICAL FIELD

This specification refers to embodiments of a method of producing a semiconductor device and to embodiments of a semiconductor device. In particular, this specification refers to embodiments of a method of producing a semiconductor device having a reduced emitter efficiency and to corresponding embodiments of a semiconductor device.

BACKGROUND

Many functions of modern devices in automotive, consumer and industrial applications, such as converting electrical energy and driving an electric motor or an electric machine, rely on semiconductor devices. For example Insulated Gate Bipolar Transistors (IGBTs), Metal Oxide Semiconductor Field Effect Transistors (MOSFETs) and diodes have been used for various applications including, but not limited to switches in power supplies and power converters.

Sometimes, it can be desirable to provide such power semiconductor devices with a reduced emitter efficiency so as to minimize switching losses. For example, in a reverse conducting IGBT, switching losses due to the reverse recovery of a monolithically integrated diode may be reduced by a reduction of the anode efficiency of the monolithically integrated diode.

SUMMARY

According to an embodiment, a method of producing a semiconductor device is presented. The method comprises providing a semiconductor body having a front side and a back side, wherein the semiconductor body includes a drift region having dopants of a first conductivity type and a body region having dopants of a second conductivity type complementary to the first conductivity type, a transition between the drift region and the body region forming a pn-junction. The method further comprises: creating a contact groove in the semiconductor body, the contact groove extending into the body region along a vertical direction pointing from the front side to the back side; and filling the contact groove at least partially by epitaxially growing a semiconductor material within the contact groove, wherein the semiconductor material has dopants of the second conductivity type. Further, a dopant concentration of the epitaxially grown semiconductor material is lower than a maximum of the dopant concentration of the body region external of the contact groove.

According to a further embodiment, a semiconductor device is presented. The semiconductor devices comprises a semiconductor body having a front side and a back side, wherein the semiconductor body includes: a drift region having dopants of a first conductivity type and a body region having dopants of a second conductivity type complementary to the first conductivity type, a transition between the drift region and the body region forming a pn-junction. The body region includes a contact groove extending along a vertical direction pointing from the front side to the back side, the contact groove being at least partially filled with an epitaxially grown semiconductor material having dopants of the second conductivity type. Further, a dopant concentration of the epitaxially grown semiconductor material is lower than a maximum of the dopant concentration of the body region external of the contact groove.

According to yet a further embodiment, a further semiconductor device is presented. The further semiconductor device comprises a semiconductor body having a front side and a back side, wherein the semiconductor body includes: a drift region having dopants of a first conductivity type and a body region having dopants of a second conductivity type complementary to the first conductivity type, a transition between the drift region and the body region forming a pn-junction. The body region comprises a contact groove extending along a vertical direction pointing from the front side to the back side, the contact groove being at least partially filled with a semiconductor material having dopants of the second conductivity type at a dopant concentration that is lower than a dopant concentration of the body region external of the contact groove. At a transition from the semiconductor material inside the contact groove to a section of the body region external of the contact groove, a concentration of dopants of the second conductivity type increases by a factor of at least 10 within a distance of up to 500 nm.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1A:
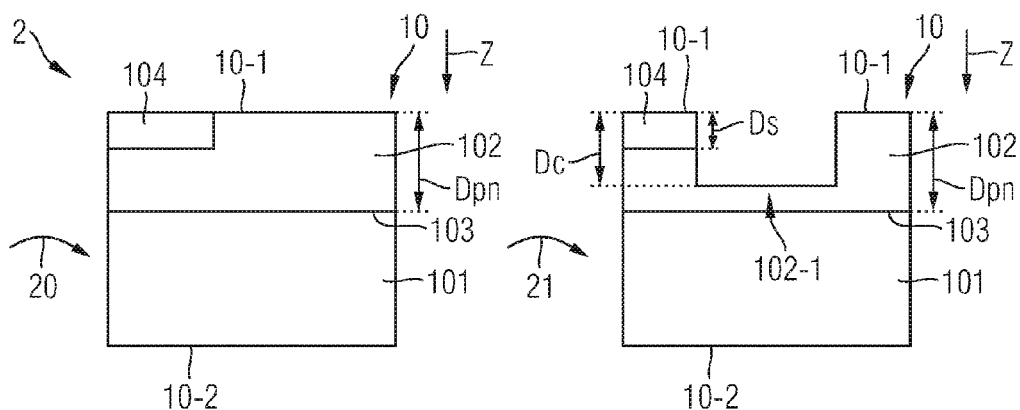
FIG. 1A schematically illustrates a method of producing a semiconductor device according to one or more embodiments.
Figure 1A:
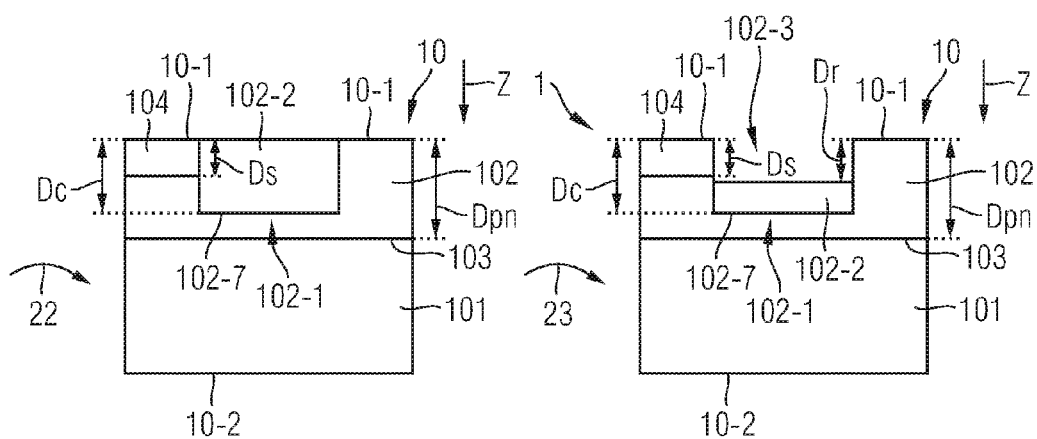
Figure 1A:
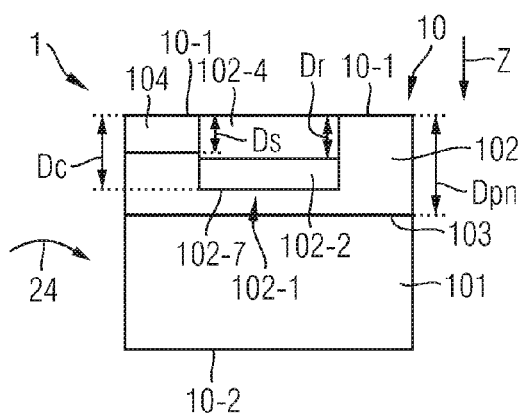

In the following detailed description, reference is made to the accompanying drawings which form a part hereof and in which are shown by way of illustration of specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor region.

In this specification, n-doped may be referred to as "first conductivity type" while p-doped may be referred to as "second conductivity type". Alternatively, opposite doping relations can be employed so that the first conductivity type can be p-doped and the second conductivity type can be n-doped. For example, an n-doped semiconductor region can be produced by inserting donors into a semiconductor region. Further, a p-doped semiconductor region can be produced by inserting acceptors into a semiconductor region.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor arrangement or between different terminals of one or more devices or between a terminal or a metallization or an electrode and a portion or part of a semiconductor arrangement. Further, in the context of the present specification, the term "in contact" intends to describe that there is a direct physical connection between two elements of the respective semiconductor arrangement; e.g., a transition between two elements being in contact with each other may not include a further intermediate element or the like.

Specific embodiments described in this specification pertain to, without being limited thereto, monolithically integrated semiconductor arrangements having an IGBT, an RC-IGBT (reverse conducting IGBT), a MOSFET or a diode structure.

The term "power semiconductor device" as used in this specification intends to describe a semiconductor device on a single chip with high voltage blocking and/or high current-carrying capabilities. Such semiconductor device may be part of a semiconductor arrangement. In other words, the power semiconductor devices are intended for high current, such as in the Ampere range, e.g., up to several hundred Ampere, and/or high voltages, such as above 40 V, 100 V and above.

Further, within this specification, the term "dopant concentration" may refer to an integral dopant concentration or, respectively, to a mean dopant concentration or to a sheet charge carrier concentration of a specific semiconductor region or semiconductor layer. Thus, e.g., a statement saying that a dopant concentration of a specific semiconductor region is higher or lower as compared to a dopant concentration of another semiconductor region may indicate that the respective mean dopant concentrations of the semiconductor regions differ from each other.

Figure 1B:
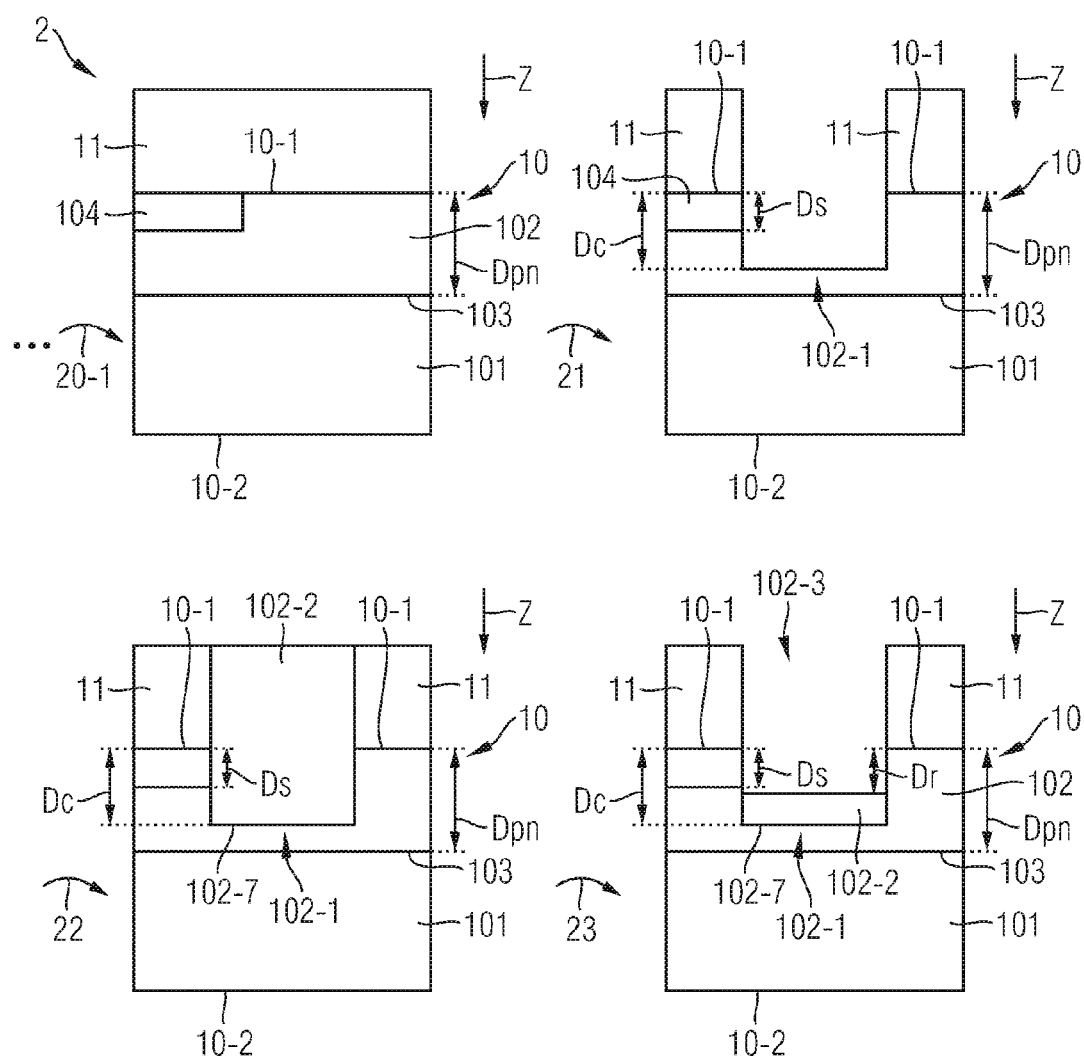
FIG. 1B schematically illustrates a method of producing a semiconductor device according to one or more embodiments.
Figure 4A:
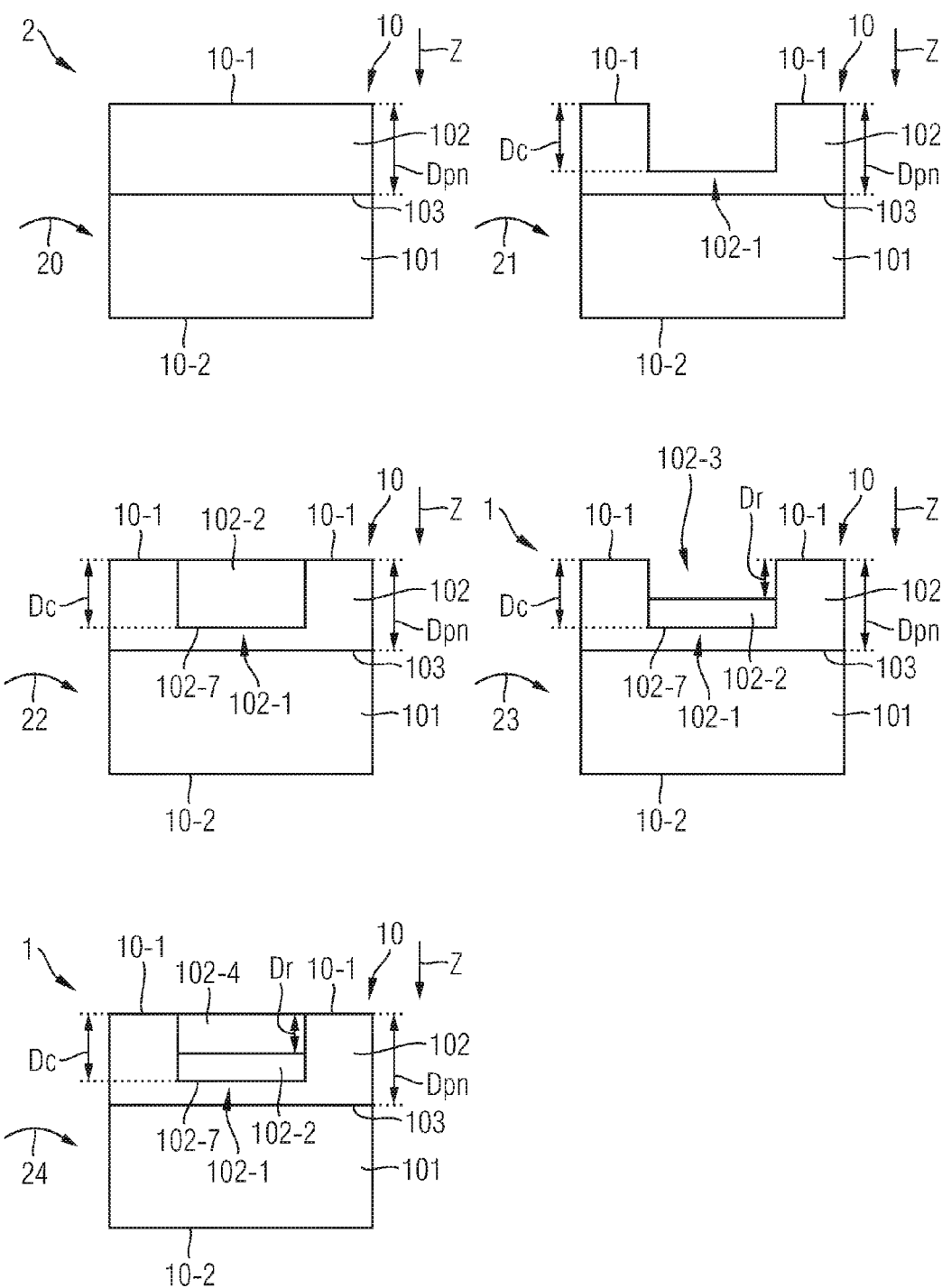
FIG. 4A schematically illustrates a method of producing a semiconductor device according to one or more embodiments.

FIGS. 1A and 4A schematically illustrate methods 2 of producing a semiconductor device 1 according to one or more embodiments. FIG. 1B schematically illustrates a variant of the method 2 of producing a semiconductor device shown in FIG. 1A. In the following, reference will be made to FIGS. 1A, 1B and 4A.

As illustrated in FIGS. 1A and 4A, the method 2 comprises, in a first step 20, providing a semiconductor body 10 having a front side 10-1 and a back side 10-2. For example, the front side 10-1 is a front side 10-1 of a semiconductor wafer, and the back side 10-2 is a back side of the semiconductor wafer. Both the front side 10-1 and the back side 10-2 may be arranged in parallel to each other and may each extend along a respective horizontal plane. For instance, such a semiconductor wafer exhibits a diameter of 200 mm, 300 mm, or 450 mm.

The provided semiconductor body 10 may include a drift region 101, wherein the drift region 101 can have dopants of a first conductivity type. For example, the drift region 101 is an n-doped (or p-doped) drift region of an n-channel (or p-channel) IGBT or of an n-channel (or p-channel) MOSFET to be produced. The drift region 101 can also be a drift region of a diode, e.g., a lightly n-doped drift region of a pin diode to be produced. The drift region 101 may be configured to conduct a load current received by a first load contact E to be arranged on the front side 10-1 of the semiconductor body 10 and/or by a second load contact C to be arranged on the back side 10-2 of the semiconductor body 10 (see FIG. 2).

The provided semiconductor body 10 may further include a body region 102 having dopants of a second conductivity type complementary to the first conductivity type, wherein a transition between the drift region 101 and the body region 102 forms a pn-junction 103. For example, the body region 102 is a p-doped (or n-doped) body region 102 of an n-channel (or p-channel) MOSFET to be produced. In another embodiment, the body region 102 may be a p-doped (or n-doped) base region of an n-channel (or p-channel) IGBT to be produced. In yet another embodiment pertaining to FIG. 4A, the body region 102 may be, e.g., a p-doped anode region of a diode to be produced. For example, an upper end of the body region 102 defines the front side 10-1.

In an embodiment, providing (step 20) the semiconductor body 10 includes creating the body region 102 by carrying out at least one of an implantation step for implanting the dopants of the second conductivity type and a diffusion step for diffusing the dopants of the second conductivity type. For example, the dopants of the body region 102 of the provided (step 20) semiconductor body 10 may have been diffused or implanted into the semiconductor body 10 from the front side 10-1. For example, the body region 102 is p-doped, and the p-type dopants are diffused boron atoms.

Figure 2:
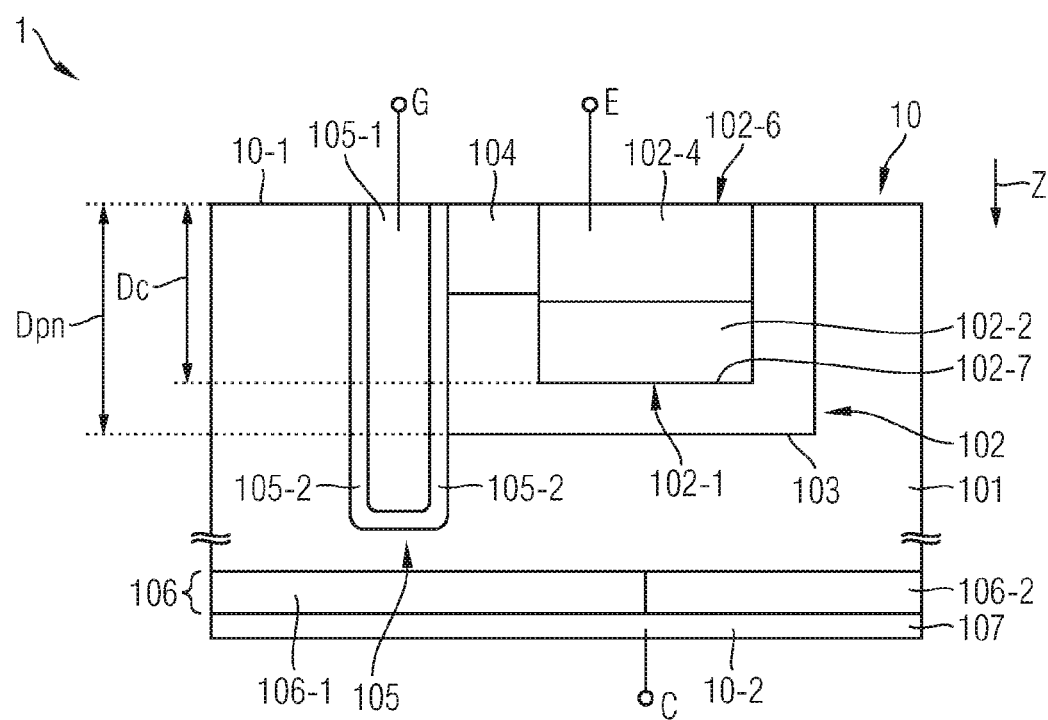
FIG. 2 schematically illustrates a section of a vertical cross-section of a semiconductor device according to one or more embodiments.

A pn-junction 103 formed at the transition between the drift region 101 and the body region 102 is, for example, configured to block a voltage between the first load contact E and the second load contact C of a semiconductor device 1 to be produced (see FIG. 2). The pn-junction 103 may be located at a depth Dpn below the front side 10-1 of the semiconductor body 10, as measured along a direction Z vertical to the front side 10-1, e.g., perpendicular to the horizontal planes. For example, the vertical direction Z is perpendicular to a surface of a semiconductor wafer comprising the semiconductor body 10.

Further, as illustrated in FIGS. 1A and 1B, the provided semiconductor body 10 may include a source region 104 having dopants of the first conductivity type, wherein the source region 104 can be isolated from the drift region 101 by the body region 102. For instance, the source region 104 is an $n^+$-doped (or $p^+$-doped) source region 104 of an n-channel (or p-channel) MOSFET or of an n-channel (or p-channel) IGBT.

In the embodiment depicted in FIG. 4A, the provided semiconductor body 10 does not include a source region 104. For example, the semiconductor device 1 to he produced with the method 2 illustrated in FIG. 4A is a diode.

As a next step 21, the method 2 may comprise creating a contact groove 102-1 in the semiconductor body 10. The contact groove 102-1 extends into the body region 102 along the vertical direction Z pointing from the front side 10-1 to the back side 10-2.

According to an embodiment in accordance with FIGS. 1A and 1B, the provided (step 20) semiconductor body 10 comprises a transistor cell of the semiconductor device 1 to be produced, wherein the transistor cell comprises the drift region 101, the body region 102, and the source region 104, and wherein the contact groove 102-1 is created (step 21) in the transistor cell, the contact groove 102-1 extending into the body region 102 of the transistor cell and being at least partially laterally confined by the source region 104 of the transistor cell. For example, the transistor cell can be a transistor cell of an IGBT, an RC-IGBT or a MOSFET to be produced.

According to an embodiment depicted in FIG. 1B, the method 2 further comprises, before the step 21 of creating the contact groove 102-1, a step 20-1 of creating, on the front side 10-1 of the semiconductor body 10, an insulating layer 11, the insulating layer 11 being in contact with the body region 102. For example, the insulating layer 11 is an intermediate oxide layer provided for insulating a first conductor region, for example a polysilicon gate electrode within a transistor cell, from a second conductor region to be arranged on top of the insulating layer 11. For example, the second conductor region is a contact metal for contacting the source region 102 of a transistor cell.

The step 20-1 of creating an insulating layer 11 as depicted in FIG. 1B and all subsequent steps involving the insulating layer 11 can be applied analogously to the embodiment illustrated in FIG. 4A, i.e., subsequently to providing (step 20) a semiconductor body 10 that does not include a source region 104. For example, a method 2 of producing a diode 1 may involve the step 20-1 of creating an insulating layer 11 in contact with the body region 102 and subsequent steps analogous to the steps 21 to 23 depicted in FIG. 1B.

For example, the step 21 of creating the contact groove 102-1 includes a lithographic process and at least one of plasma etch process and a wet etch process, e.g. as known in the art.

In the variant of the method 2 illustrated in FIG. 1B, such an etch process may be carried out through the insulating layer 10 such that the contact groove 102-1 extends through the oxide layer 11 into the body region 102 along the vertical direction Z, the contact groove 102-1 being at least partially laterally confined by the insulating layer 11. For example, during such an etch process, the etching parameters may be adjusted such that etching of the body region 102 (comprising, e.g., silicon) occurs faster than etching of the insulating layer 11 (e.g., an oxide layer).

In an embodiment, a depth Dc of the contact groove 102-1 amounts to at least 20% of the distance Dpn between the front side 10-1 and the pn-junction 103 as measured along the vertical direction Z. As indicated above, the front side 10-1 can be defined by the upper end of the body region 102.

For example, the depth Dpn of the pn-junction 103 is about 3 µm and the depth Dc of the contact groove 102-1 is at least 0.6 µm. In another embodiment, the depth Dc of the contact groove 102-1 may be equal to or even greater than the distance Dpn between the front side 10-1 and the pn-junction 103. The contact groove may thus extend through the entire body region 102 along the vertical direction Z.

According to a further embodiment, the contact groove 102-1 extends into at least 10% of the volume of the body region 102. In a variant, the contact groove 102-1 extends into at least 30% of the volume of the body region 102.

The contact groove 102-1 can be at least partially laterally confined by the source region 104, as shown in FIGS. 1A and 1B. The source region 104 may thus form at least a part of a side wall of the contact groove 102-1. For example, creating (step 21) the contact groove 102-1 includes etching through the source region 104 along the vertical direction Z.

As a further step 22 illustrated in FIGS. 1A, 1B and 4A, the method 2 may include filling the contact groove 102-1 at least partially by epitaxially growing a semiconductor material 102-2 within the contact groove 102-1, wherein the semiconductor material 102-2 may have dopants of the second conductivity type.

For example, epitaxially growing the semiconductor material 102-2 comprises a chemical vapor deposition (CVD) process. Growing the semiconductor material 102-2 may include a selective epitaxial process. For example, the epitaxial growth (step 22) may be selective with respect to properties of a contact groove bottom and/or of contact groove side walls on top of which the semiconductor material 102-2 is grown. In the embodiment depicted in FIG. 1B, the epitaxial growth (step 22) may be selective so as to occur only at the contact groove bottom and the contact groove side walls, but not on top of the insulation layer 11. For example, the insulation layer 11 may comprise an oxide, whereas the body region 102 may comprise silicon, and the epitaxial process (step 22) may be configured to occur on silicon, but not on oxide.

In a variant, the step 22 of filling the contact groove 102-1 comprises an oxidation step, e.g., so as to prepare the contact groove bottom and the contact groove side walls for the epitaxial growth of the semiconductor material 102-2. In a further development of the variant, the oxidation step is followed by a wet etch process, e.g., so as to prepare for the epitaxial growth (step 22) of the semiconductor material 102-2. In the embodiment depicted in FIG. 1B, the structured insulation layer 11, which may, e.g., comprise an oxide, may be configured to protect portions of the semiconductor body 10, which are covered by the insulation layer 11, from the effects of preparatory steps for the epitaxial growth (step 22), such as an oxidation step and/or a wet etch process.

In an embodiment, a dopant concentration of the epitaxially grown semiconductor material 102-2 is lower than a maximum of the dopant concentration of the body region 102, e.g., at least by a factor of 2, at least by a factor of 5, at least by a factor of 8, or at least by a factor of 10 , For example, a concentration of the dopants in the body region 102 amounts to at least $10^{16}$ cm$^{-3}$, and a concentration of the dopants of the epitaxially grown semiconductor material 102-2 is in the range from 0 to $10^{16}$ cm$^{-3}$. For example, the dopant concentration of the epitaxially grown semiconductor material 102-2 is lower than an average dopant concentration of the body region 102, e.g., at least by a factor of 2, at least by a factor of 5, at least by a factor of 8, or at least by a factor of 10.

In an embodiment, the method 2 further comprises a step 23 of partially removing the epitaxially grown semiconductor material 102-2, thereby creating a recess 102-3 in the semiconductor body 10. As shown in FIGS. 1A and 1B, the recess 102-3 can be at least partially laterally confined by the source region 104. The source region 104 may thus form at least a part of a side wall of the recess 102-3. For example, the recess 102-3 is a contact hole of a MOSFET or an IGBT or an RC IGBT to be produced.

For example, the step 23 of partially removing the epitaxially grown semiconductor material 102-2 comprises a plasma etch process. Such a plasma etch process may be carried out as a masked plasma etch process. For example, as illustrated in FIG. 1B, the insulating layer 11, which has been structured upon creation of the contact groove 102-1 (step 21), may serve as a hard mask for creating the recess 102-3 with an etch process. Thus, the step 23 of partially removing the epitaxially grown semiconductor material 102-2 can be carried out as a self-aligned process (see FIG. 1B).

For instance, a depth Dr of the recess 102-3 as measured from the front side 10-1 along the vertical direction Z amounts to at least a depth Ds of the source region 104, wherein the source region 104 exhibits the depth Ds in a zone where it laterally confines the contact groove 102-1 at least partially (see FIGS. 1A and 1B). For example, the depth Dr is in the range from 300 nm to 500 nm.

According to an embodiment, the method 2 further comprises a step 24 of filling the recess 102-3 with a conductor material 102-4. The conductor material 102-4 may be arranged on top of and in contact with the epitaxially grown semiconductor material 102-2. For example, the conductor material 102-4 comprises at least one of aluminum, aluminum copper, aluminum silicon copper, platinum silicide, or a diffusion barrier material, such as tantalum, tantalum nitride, titanium or titanium tungsten. The step 24 of filling the recess 102-3 at least partially with the conductor material 102-4 may, for example, comprise depositing the conductor material 102-4, e,g., by using a deposition process known in the art.

Figure 3A:
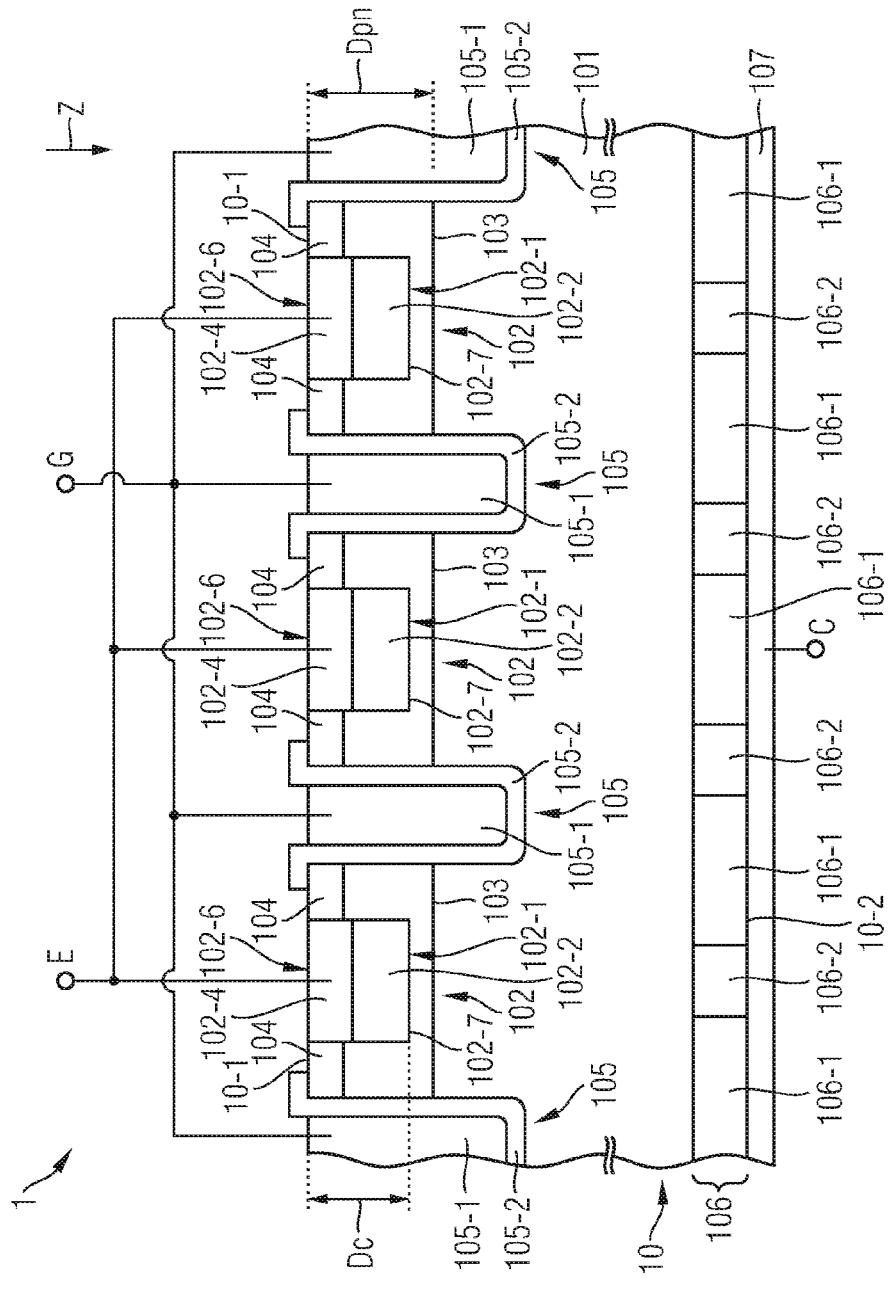
FIG. 3A schematically illustrates a section of a vertical cross-section of a reverse conducting IGBT according to one or more embodiments.
Figure 3B:
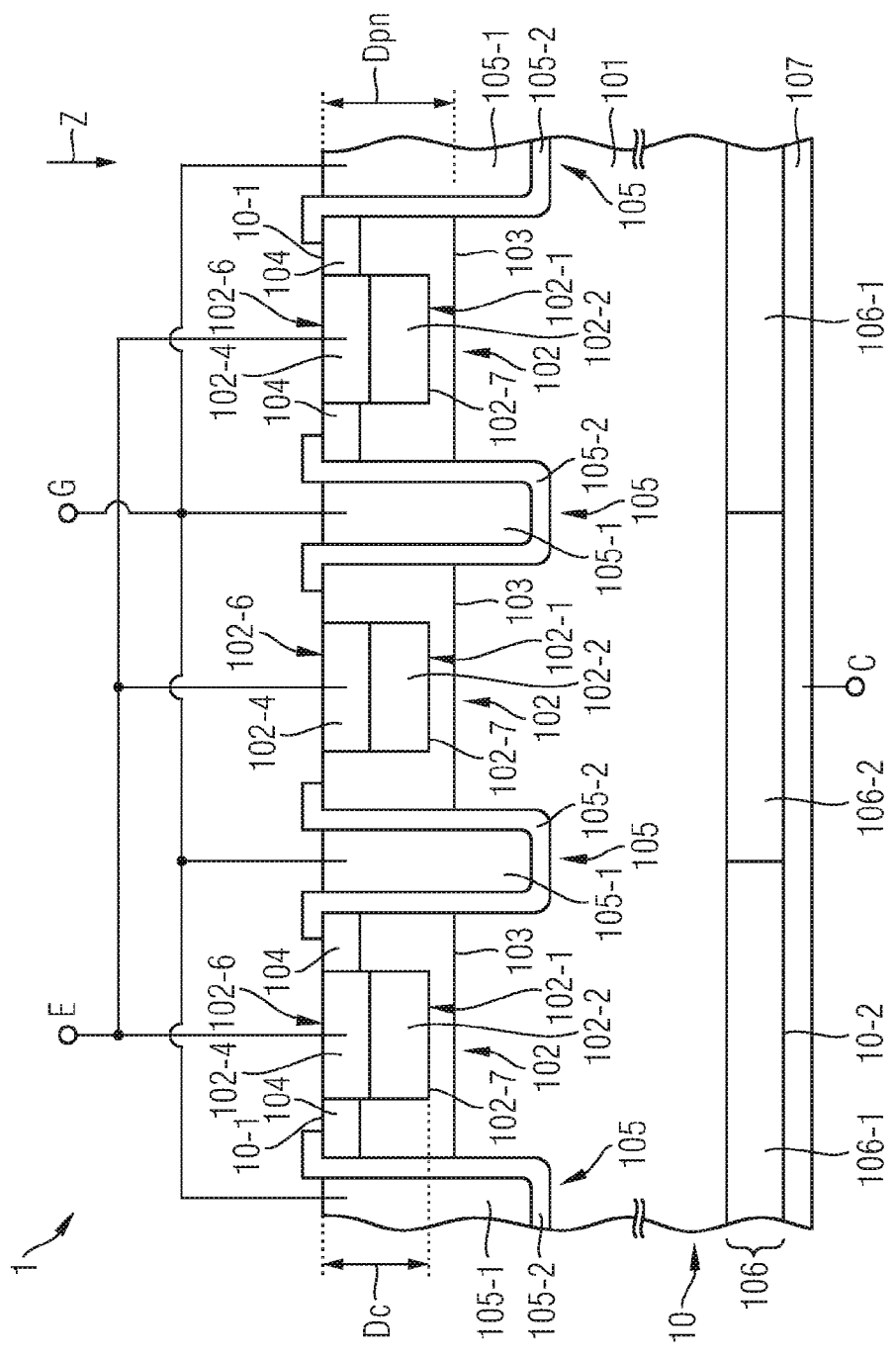
FIG. 3B schematically illustrates a section of a vertical cross-section of a reverse conducting IGBT according to one or more embodiments.
Figure 4B:
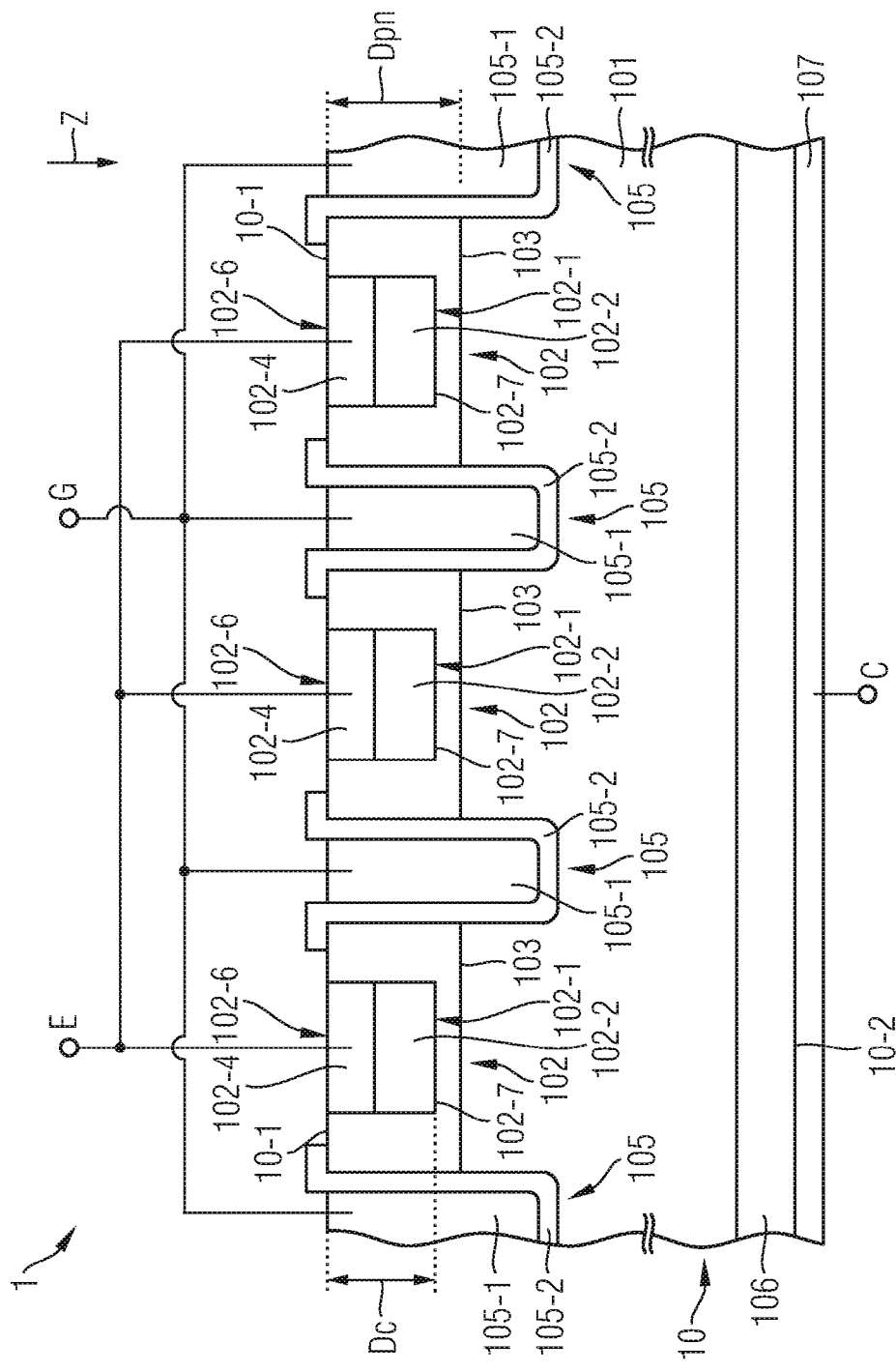
FIG. 4B schematically illustrates a section of a vertical cross-section of a diode according to one or more embodiments.

FIG. 2 schematically illustrates a section of a vertical cross-section of a semiconductor device 1 according to one or more embodiments. FIGS. 3A and 3B each schematically illustrate a section of a vertical cross-section of an RC (reverse conducting) IGBT according to one or more embodiments. FIG. 4B schematically illustrates a section of a vertical cross-section of a diode according to one or more embodiments. In the following description, reference will be made to FIGS. 2 to 3B and 4B. Such a semiconductor device 1 as depicted in FIGS. 2 to 3B and 4B may have been produced using the method 2 as described above with reference to FIGS. 1A, 1B and 4A.

The semiconductor device 1 may comprise a semiconductor body 10 having a front side 10-1 and a back side 10-2, as described above in connection with the method 2 of producing a semiconductor device 1. Likewise, the semiconductor body 10 of each of the semiconductor devices 1 depicted in FIGS. 2 to 3B and 4B may include a drift region 101 having dopants of a first conductivity type and a body region 102 having dopants of a second conductivity type complementary to the first conductivity type, wherein a transition between the drift region 101 and the body region 102 forms a pn-junction 103. In accordance with FIGS. 2 to 3B, the semiconductor body 10 may further include a source region 104 having dopants of the first conductivity type and being isolated from the drift region 101 by the body region 102. What has been stated above with regards to these components 101, 102, 103 and 104 may equally apply to the embodiments schematically illustrated in FIGS. 2 to 3B and 4B discussed in the following.

For example, the semiconductor body 10 has been provided according to step 20 of the method 2 described above with respect to FIGS. 1A,1B or 4A. In accordance with FIGS. 2 to 3B, the semiconductor device 1 may, for instance, comprise a transistor cell, wherein the transistor cell comprises the drift region 101, the body region 102 and the source region 104. For example, in an embodiment in accordance with FIG. 2, the semiconductor device 1 comprises one of an IGBT and a MOSFET, wherein the semiconductor body 10 comprises a transistor cell of the IGBT or MOSFET. In accordance with FIG. 4B, the semiconductor device 1 may comprise a diode cell, e,g., a MOS gated diode (MGD) cell. For example, the semiconductor device 1 is a diode, e.g., a pin diode. In a variant, the semiconductor device 1 is a MOS gated diode.

In a variant, the semiconductor device 1 is a reverse conducting IGBT, wherein the semiconductor body 10 comprises a plurality of transistor cells arranged next to one another, as depicted exemplarily in FIGS. 3A. The vertical cross-section of each of the three substantially identical transistor cells shown in FIG. 3A exhibits a body region 102, two source regions 104 (which may be connected with each other outside of the plane of the depicted vertical cross-section) and one half of each of two trenches 105, which laterally confine the transistor cell. The trenches 105 can be gate trenches. The trenches 105 will be explained in more detail below. By contrast, FIG. 3B depicts another exemplary embodiment of a reverse conducting IGBT, wherein the semiconductor body 10 comprises, in addition to at least two transistor cells (shown on the right side and on the left side of FIG. 3B, respectively), at least one diode cell (shown in the middle of FIG. 3B) arranged between the at least two transistor cells. The diode cell can be exclusively configured for diode operation of the reverse conducting IGBT and therefore does not comprise a source region 104, which, in combination with the body region 102 and the trench 105, would allow for a transistor operation. For example, a plurality of such diode cells may be arranged next to each other. It is also conceivable to provide a shared transistor/diode cell (not depicted) within the semiconductor body 10 of a reverse conducting IGBT, wherein, in a vertical cross-section, the shared transistor/diode cell comprises only one source region 104 being in contact with, for example the trench 105 on the left side of the transistor/diode cell, and wherein no source region 104 is provided next to the trench 105 on the right side of the transistor/diode cell.

The drift region 101 of the semiconductor device 1 depicted in FIG. 2 can be, for example, an n-doped drift region 101 of an n-channel IGBT or of an n-channel MOSFET. The drift region 101 of the embodiments of FIGS. 3A and 3B is, for example, an n-doped drift region of an n-channel reverse conducting IGBT. As explained above, in other embodiments, opposite doping relations can be employed. In an embodiment pertaining to FIG. 4B, the drift region 101 can also be a drift region of a diode. For example, the drift region 101 is a lightly n-doped drift region of a pin diode. The drift region 101 may be configured to conduct a load current received by a first load contact E on the front side 10-1 of the semiconductor body 10 or by a second load contact C on the back side 10-2 of the semiconductor body 10.

The body region 102 may be, for instance, a p-doped body region of the n-channel MOSFET or a p-doped base region of the n-channel IGBT or of the n-channel reverse conducting IGBT. The pn-junction 103 formed by the transition between the drift region 101 and the body region 102 may be configured to block a voltage between the first load contact E and the second load contact C of the semiconductor device 1. The source region 104 is, for example, an n-doped source region 104 of the n-channel MOSFET or of the n-channel IGBT or n-channel reverse conducting IGBT. In another embodiment in accordance with FIG. 4B, the body region 102 may be, e.g., a p-doped anode region of a diode, e.g., a MOS gated diode.

As depicted in FIGS. 2 to 3B and 4B, the body region 102 in the exemplary embodiments may include at least one contact groove 102-1, which extends along the vertical direction Z pointing from the front side 10-1 to the back side 10-2 of the semiconductor body 10. The contact groove 102-1 can be at least partially laterally confined by the source region 104, as shown in FIGS. 2 to 3B. Thus, the source region 104 may form at least a part of a side wall of the contact groove 102-1. In an embodiment, a depth Dc of the contact groove 102-1 amounts to at least 20% of the distance Dpn between the front side 10-1 and the pn-junction 103 as measured along the vertical direction Z. For example, the depth Dpn of the pn-junction 103 is about 3 μm and the depth Dc of the contact groove 102-1 is at least 0.6 μm. In another embodiment (not depicted), the depth Dc of the contact groove 102-1 may be equal to or greater than the distance Dpn between the front side 10-1 and the pn-junction 103. The contact groove may thus extend through the entire body region 102 along the vertical direction Z.

The contact groove 102-1 can be at least partially filled with a semiconductor material 102-2 having dopants of the second conductivity type. For example, the contact groove 102-1 has been produced using the process steps 20 to 23 of the method 2 described above with regards to FIGS. 1A and 1B. Thus, the semiconductor material 102-2 can be arranged within the contact groove 102-1 by means of epitaxial growth.

In an embodiment, a dopant concentration of the semiconductor material 102-2 is lower than a maximum of the dopant concentration of the body region 102 external of the contact groove 102-1, e.g., at least by a factor of 10. For example, a concentration of p-type dopants in the body region 102 amounts to at least $10^{16}$ cm$^{-3}$, whereas a concentration of p-type dopants of the semiconductor material 102-2 is in the range from 0 to $10^{15}$ cm$^{-3}$.

In another embodiment of the semiconductor device 1 in accordance with FIGS. 2, 3A and 3B, the semiconductor material 102-2 has been arranged within the contact groove 102-1 by one of epitaxial growth or a processing technique other than epitaxial growth. At a transition 102-7 from the semiconductor material 102-2 inside the contact groove 102-1 to a section of the body region 102 external of the contact groove 102-1, a concentration of dopants of the second conductivity type may increase by a factor of at least 10 within a distance of up to 100 nm. In other embodiments, a concentration of dopants of the second conductivity type increases by a factor of at least $10^2$, or $10^3$, or $10^4$ within the distance of up to 100 nm at the transition 102-7. The body region 102 may thus comprise a sharp transition between a region having a relatively low dopant concentration and another region having a relatively high dopant concentration, the region of relatively low dopant concentration being located inside the contact groove 102-1, and the region of relatively high dopant concentration being located outside the contact groove 102-1.

In yet a further embodiment, the transition 102-7 can be smoother, and a concentration of dopants of the second conductivity type increases by a factor of at least 10 within a distance of 500 nm. In other embodiments, a concentration of dopants of the second conductivity type increases by a factor of at least $10^2$, or $10^3$, or $10^4$ within the distance of 500 nm.

The transition 102-7 may be a transition along the vertical direction Z and/or a transition along a horizontal direction. For example, the increase of the dopant concentration exemplarily mentioned above may occur along the entire transition area between the semiconductor material 102-2 inside the contact groove 102-1 to the section of the body region 102 external of the contact groove 102-1.

According to an embodiment and as explained above, the semiconductor material 102-2 inside the contact groove 102-1 can be an epitaxially grown semiconductor material, and the dopants in the section of the body region 102 external of the contact groove 102-1 can be implanted dopants or diffused dopants. For example, the semiconductor material 102-2 inside the contact groove 102-1 has been grown epitaxially according to step 22 of the method 2 described above. By contrast, the dopants in the section of the body region 102 external of the contact groove 102-1 may have been diffused or implanted into the semiconductor body 10 from the front side 10-1. For example, the body region 102 is p-doped, and the p-type dopants are diffused boron atoms.

As illustrated in each of FIGS. 2 to 3B and 4B and as described above, the semiconductor device 1 can further comprises the trench 105 extending into the semiconductor body 10 along the vertical direction Z. The trench 105 can be in contact with the body region 102 and the drift region 101. In accordance with the embodiments schematically illustrated in FIGS. 2 to 3B, the trench 105 may also be in contact with the source region 104. The trench 105 may comprise a trench electrode 105-1 and an insulator 105-2. The insulator 105-2 may insulate the trench electrode 105-1 from the body region 102 and the drift region 101. In the embodiments of FIGS. 2 to 3B, the insulator 105-2 may also insulate the trench electrode 105-1 from the source region 104. For instance, the trench 105 is a gate trench 105 of a transistor cell of the semiconductor device 1.

In accordance with the embodiments illustrated in FIGS. 3A and 3B, each of the plurality of trenches 105 can be a gate trench 105 of at least one transistor cell of a reverse conducting IGBT. In FIG. 3A, three substantially identical transistor cells of a reverse conducting IGBT, which are arranged next to each other, are depicted in a vertical cross-section.

According to an embodiment, the semiconductor device 1 may further comprise a gate terminal G, wherein the trench electrode 105-1 is electrically connected to the gate terminal G, which is configured to receive an electric signal from external of the semiconductor device 1. For example, the gate electrode 105-1 may be configured to receive a control signal, such as gate voltage signal, from a gate driver (not illustrated) external of the semiconductor device 1. The trench electrode 105-1 may be arranged and configured to induce a depletion channel extending along the insulator 105-2 inside the body region 102 in dependence of the gate voltage signal. Such a depletion channel may allow a load current to flow through the source region 104, which can be electrically connected to the first load contact E, and through the drift region 101, which can be electrically connected to the second load contact C of the semiconductor device 1, wherein the electrical connection between the drift region 101 and the second load contact C may be established via a back side region 106 and a contact metal 107, which will be described in more detail below.

In a variant, not all trench electrodes 105-1 of the semiconductor device 1 are electrically connected to the gate terminal G, but some of the trench electrodes 105-1 are floating or are electrically connected to the first load contact E of the semiconductor device 1. For example, the semiconductor device 1 is a reverse conducting IGBT comprising diode cells as explained above with regards to FIG. 3B, and the gate trenches 105 of the diode cells are floating or electrically connected to the first load contact E instead of the gate terminal G.

In an embodiment, the contact groove 102-1 comprises a conductor material 102-4 arranged above the semiconductor material 102-2 inside the contact groove 102-1, wherein the arranged conductor material 102-4 may form a contact region 102-6 that is isolated from the drift region 101 by the body region 102. In accordance with the embodiments depicted in FIGS. 2 to 3B, the contact region 102-6 may be in contact with the source region 104, while being at least partially laterally confined by the source region 104. In an embodiment, the contact region 102-6 is electrically connected to the first load contact E of the semiconductor device 1, wherein the first load contact E is configured to receive and/or output the load current from/to external of the semiconductor device 1. For example, the contact region 102-6 is a metallization inside a contact hole that is electrically connected to an external source contact of a MOSFET or an external emitter contact of an IGBT or of a reverse conducting IGBT. In an embodiment, the contact hole has been produced by creating the recess 102-3, as explained with regards to FIGS. 1A, 1B and 4A (cf. step 23).

In an embodiment, the trench electrode 105-1 is electrically insulated from the contact region 102-6. For example, the trench electrode 105-1 is electrically insulated from the contact region 102-6 by an oxide (not illustrated) or another insulating material arranged between the trench electrode 105-1 and the contact region 102-6.

As illustrated in FIGS. 2, 3A and 3B, according to an embodiment, the semiconductor device 1 further comprises a metal contact 107 contacting the back side 10-2 of the semiconductor body 10 and a second load contact C being electrically connected to the metal contact 107, the second load contact C being configured to output and/or receive the load current from/to external of the semiconductor device 1. The semiconductor body 10 may be configured to conduct the load current between the first load contact E and the second load contact C. For example, the metal contact 107 comprises a back side metallization 107 being in contact with a drain terminal of a MOSFET or a collector terminal of an IGBT or of a reverse conducting IGBT.

In accordance with the embodiments illustrated in FIGS. 2, 3A, 3B and 4B, the semiconductor body 10 may further comprise a semiconductor back side region 106 (in the following referred to as "back side region 106") extending laterally along the back side 10-2 and contacting the metal contact 107, wherein the back side region 106 has dopants of the first conductivity type and/or dopants of the second conductivity type. A dopant concentration of the back side region 106 may be higher than a dopant concentration of the drift region 101. For example, the back side region 106 is an $n^+$-doped back side region of a MOSFET or of a diode. In another embodiment, the back side region 106 is a $p^+$-doped back side emitter region of an IGBT.

In accordance with the embodiments illustrated in FIGS. 3A and 3B, the back side region 106 comprises at least one emitter region 106-1 having dopants of the second conductivity type and the at least one short region 106-2 having dopants of the first conductivity type, the at least one emitter region 106-1 and the at least one short region 106-2 each being in contact with the metal contact 107 and with the drift region 101. For instance, the semiconductor device 1 is a reverse conducting n-channel IGBT having the back side region 106 that comprises at least one p-doped emitter region 106-1 and a plurality of n-doped short regions 106-2, e.g., in order to allow for both transistor and diode operation of the semiconductor device 1.

FIGS. 3A and 3B illustrate two different variants of partitioning the back side region 106 between emitter regions 106-1 and short regions 106-2. For example, the back side region 106 depicted in a vertical cross-section in FIG. 3A can comprise a large connected p-doped emitter region 106-1 and a plurality of n-doped short regions 106-2 which are at least partially surrounded by the large emitter region 106-1. In a horizontal cross-section (not depicted) of the back side region 106 the n-short regions 106-2 may, for example, exhibit a substantially circular shape, a square shape, a rectangular shape, a strip shape or other shape. The n-short regions 106-2 may be arranged within a horizontal plane in a regular or pattern or may be distributed randomly. By contrast, FIG. 3B shows an embodiment having two relatively large emitter regions 106-1 arranged each below a transistor cell of the reverse conducting IGBT and a substantially equally large short region 106-2, which is arranged between the emitter regions 106-1 and below a diode cell of the reverse conducting IGBT, wherein the diode cell does not comprise a source region 104 and is configured exclusively for diode operation, as explained above. In a horizontal plane, the short regions 106-2 of the reverse conducting IGBT depicted in FIG. 3B may, for example, follow a pattern so as to systematically extend below the diode regions. For example, the short regions 106-2 may exhibit a square shape, rectangular shape, a strip shape corresponding to a shape of the diode cells.

The semiconductor device 1 illustrated in FIG. 4B may comprise several substantially identical diode cells which do not comprise a source region 104. Each diode cell can be confined by trenches 105 similarly to the diode cell of FIG. 3B. For example, the semiconductor device 1 of FIG. 4B is a power diode, which may have been produced carrying out the steps depicted schematically in FIG. 4A.

The embodiments described above include the recognition that, for example, in some reverse conducting IGBTs, in the reverse conducting state, the body region may inject a large quantity of holes into the drift region, thereby causing relatively large power losses during switching. Thus, a reduction of the emitter efficiency of the built-in diode in such reverse conducting IGBTs may be desirable. At the same time, requirements with regards to, e.g., the threshold voltage of the reverse conducting IGBT need to be considered, which may impose limits on the design of the body region in terms of, e.g., a dopant concentration in a channel region in the vicinity of a gate trench.

In accordance with one or more embodiments, it is proposed to provide a contact groove within the body region of a semiconductor device, wherein the contact groove is at least partially filled with a semiconductor material having a dopant concentration that is lower than a dopant concentration of the body region external of the contact groove. Thus, the overall emitter efficiency of the body region can be reduced, resulting, e.g., in reduced power losses during changing between reverse conducting diode operation and transistor operation.

Partially filling a relatively deep contact groove of a semiconductor device to be produced by epitaxial growth of a semiconductor material can have further advantages in terms of, for example, a reduced (i.e., flattened) topography to be covered by a contact metallization. This may come with the benefit of an increased flexibility in the choice of material of the contact metallization (e.g. aluminum may be deposited instead of hot aluminum copper), which may, for example, render the use of a diffusion barrier metallization and of a platinum silicide layer for establishing a good ohmic metal-semiconductor contact unnecessary. Thus, filling the contact groove partially with a semiconductor material may allow for an increased process flexibility and compatibility and reduced processing costs.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to methods of producing a semiconductor device and embodiments pertaining to semiconductor devices were explained. For example, these semiconductor arrangements and semiconductor devices are based on silicon (Si). Accordingly, a monocrystalline semiconductor region or layer, e.g., the semiconductor body 10 and the semiconductor regions 101 to 104 of exemplary embodiments, are typically a monocrystalline Si-region or Si-layer.

It should, however, be understood that the semiconductor body 10 and the semiconductor regions 101 to 104 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGainN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGainN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially local terms such as "under", "below", "lower", "over", "upper" and the like, are used for ease of description to explain the positioning of one element local to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of producing a semiconductor device, comprising:
   providing a semiconductor body having a front side and a back side, the semiconductor body including:
   a drift region having dopants of a first conductivity type; and
   a body region having dopants of a second conductivity type complementary to the first conductivity type, a transition between the drift region and the body region forming a pn-junction;
   creating a contact groove in the semiconductor body, the contact groove extending into the body region along a vertical direction pointing from the front side to the back side, a depth of the contact groove as measured between the first surface and a bottom of the contact groove along the vertical direction being less than a distance between the front side and the pn-junction as measured along the vertical direction; and
   filling the contact groove at least partially by epitaxially growing a semiconductor material within the contact groove, wherein the semiconductor material has dopants of the second conductivity type,
   wherein a dopant concentration of the epitaxially grown semiconductor material is lower than a maximum of the dopant concentration of the body region external of the contact groove.

2. The method of claim 1, wherein the semiconductor body is provided such that it further includes a source region having dopants of the first conductivity type and being isolated from the drift region by the body region, and wherein the contact groove is at least partially laterally confined by the source region.

3. The method of claim 1, wherein the dopant concentration of the epitaxially grown semiconductor material is lower than the maximum of the dopant concentration of the body region external of the contact groove at least by a factor of 10.

4. The method of claim 1, wherein the depth of the contact groove amounts to at least 20% of the distance between the front side and the pn-junction as measured along the vertical direction.

5. The method of claim 1, further comprising partially removing the epitaxially grown semiconductor material, thereby creating a recess in the semiconductor body.

6. The method of claim 5, wherein the recess is at least partially laterally confined by the source region.

7. The method of claim 5, further comprising filling the recess at least partially with a conductor material.

8. The method of claim 2, wherein the semiconductor body comprises a transistor cell, the transistor cell comprising the drift region, the body region and the source region, and wherein the contact groove is created in the transistor cell, the contact groove extending into the body region of the transistor cell and being at least partially laterally confined by the source region of the transistor cell.

* * * * *